(12) United States Patent
Johnson (10) Patent No.: US 8,779,789 B2
(45) Date of Patent: Jul. 15, 2014

(54) TRANSLATORS COUPLEABLE TO OPPOSING SURFACES OF MICROELECTRONIC SUBSTRATES FOR TESTING, AND ASSOCIATED SYSTEMS AND METHODS

(71) Applicant: Advanced Inquiry Systems, Inc., Beaverton, OR (US)

(72) Inventor: Morgan T. Johnson, Beaverton, OR (US)

(73) Assignee: Advanced Inquiry Systems, Inc., Beaverton, OR (US)

( * ) Notice: Subject to any disclaimer, the term of this patent is extended or adjusted under 35 U.S.C. 154(b) by 0 days.

(21) Appl. No.: 13/840,937

(22) Filed: Mar. 15, 2013

(65) Prior Publication Data

US 2013/0265071 A1    Oct. 10, 2013

Related U.S. Application Data

(60) Provisional application No. 61/621,954, filed on Apr. 9, 2012.

(51) Int. Cl.
   *G01R 31/20* (2006.01)

(52) U.S. Cl.
   USPC ............ 324/750.24; 324/750.16; 324/754.03; 324/754.11

(58) Field of Classification Search
   USPC ..................... 324/750.24, 765, 761, 754, 753
   See application file for complete search history.

(56) References Cited

U.S. PATENT DOCUMENTS

| 4,628,991 A | 12/1986 | Hsiao et al. |
| 5,567,654 A | 10/1996 | Beilstein, Jr. et al. |
| 5,592,730 A | 1/1997 | Greenstein et al. |
| 5,629,838 A | 5/1997 | Knight et al. |

(Continued)

FOREIGN PATENT DOCUMENTS

WO    WO 2008/011106    1/2008

OTHER PUBLICATIONS

International Preliminary Report on Patentability for PCT/US2007/016379 issued Jan. 20, 2009.

(Continued)

*Primary Examiner* — Patrick Assouad
*Assistant Examiner* — Sean Curtis
(74) *Attorney, Agent, or Firm* — Perkins Coie LLP (57) ABSTRACT

Translators coupleable to opposing surfaces of microelectronic substrates for testing, and associated systems and methods are disclosed. An arrangement in accordance with one embodiment includes a microelectronic substrate having a first major surface, a second major face facing opposite from the first major surface, and electrically conductive through-substrate vias extending through the substrate and electrically accessible from both the first and second surfaces. The arrangement further includes a first translator releasably connected to the substrate and positioned in a first region extending outwardly from the first surface, the first translator including first electrical signal paths that access the vias from the first surface, and a second translator releasably connected to the substrate simultaneously with the first translator, the second translator being positioned in a second region extending outwardly from the second surface, the second translator including second electrical signal paths that access the vias from the second surface.

19 Claims, 11 Drawing Sheets

(56) References Cited

U.S. PATENT DOCUMENTS

| | | |
|---|---|---|
| 6,100,709 A | 8/2000 | Marieb et al. |
| 6,121,065 A | 9/2000 | Wong et al. |
| 6,429,513 B1 | 8/2002 | Shermer, IV et al. |
| 6,737,879 B2 | 5/2004 | Johnson |
| 6,798,224 B1 | 9/2004 | Hembree et al. |
| 6,836,130 B2 | 12/2004 | Johnson |
| 6,853,205 B1 | 2/2005 | Cheng et al. |
| 6,897,666 B2 | 5/2005 | Swettlen et al. |
| 6,982,869 B2 | 1/2006 | Larson |
| 7,148,715 B2 * | 12/2006 | Akram et al. ............ 324/754.03 |
| 7,245,507 B2 | 7/2007 | DiBene, II et al. |
| 7,572,132 B2 | 8/2009 | Johnson et al. |
| 7,649,245 B2 | 1/2010 | Zingher et al. |
| 7,671,449 B2 | 3/2010 | Zingher et al. |
| 7,855,341 B2 | 12/2010 | Chambers |
| 8,363,418 B2 | 1/2013 | Johnson et al. |
| 2008/0309349 A1 | 12/2008 | Sutono |
| 2012/0074976 A1 * | 3/2012 | Durbin et al. ............ 324/754.11 |

OTHER PUBLICATIONS

International Search Report and Written Opinion of the International Search Authority for PCT/US2007/016379 mailed Oct. 14, 2008.

* cited by examiner

TRANSLATORS COUPLEABLE TO OPPOSING SURFACES OF MICROELECTRONIC SUBSTRATES FOR TESTING, AND ASSOCIATED SYSTEMS AND METHODS

CROSS-REFERENCE TO RELATED APPLICATIONS

The present application claims priority to U.S. Provisional Application 61/621,954, filed on Apr. 9, 2012 and incorporated herein by reference. To the extent the foregoing application and/or any other materials incorporated herein by reference conflict with the present disclosure, the present disclosure controls.

TECHNICAL FIELD

The present disclosure relates generally to translators coupleable to opposing surfaces of microelectronic substrates for testing, and associated systems and methods.

BACKGROUND

Advances in microelectronic (e.g., semiconductor) manufacturing technology have resulted in, among other things, significant reductions in the cost of sophisticated electronics. As a result, integrated circuits have become ubiquitous in the modern environment.

Integrated circuits are typically manufactured in batches. Individual batches typically contain multiple semiconductor wafers or other substrates, within and upon which integrated circuits are formed. Forming the integrated circuits requires a wide variety of semiconductor manufacturing steps, including, for example, depositing, masking, patterning, implanting, etching, planarizing, and other processes.

Each wafer typically includes hundreds of individual dies which are later separated or singulated and packaged for use. Before the dies are singulated, completed wafers are tested to determine which dies on the wafer are capable of operating according to predetermined specifications. In this manner, integrated circuits that cannot perform as desired are not packaged or otherwise incorporated into finished products.

It is typical to manufacture integrated circuits on roughly circular semiconductor substrates or wafers. Further, it is common to form such integrated circuits so that conductive regions disposed on or close to the uppermost layers of the integrated circuits are available to act as terminals for connections to various electronic elements disposed in, or on, the lower layers of the integrated circuits. During testing, these conductive regions are commonly contacted with a probe card.

Historically, unsingulated integrated circuits on a wafer were tested one at a time. In order to reduce costs and improve return on investment, the amount of time that each wafer spends in the testing process should be reduced. Various methods and apparatuses have been sought by manufacturers for testing two or more integrated circuits at the same time. In this way, wafer throughput can be increased. A typical requirement for testing more than one integrated circuit at a time is to increase the number of tester channels on the tester. In such a parallel testing arrangement, when a first one of the two or more integrated circuits is determined to fail the test program, the one or more remaining integrated circuits in that group must continue with, and complete, the test sequence before another group of integrated circuits on the wafer can begin the process of testing. This means that the tester channels dedicated to the integrated circuit that failed are not usefully occupied until the test system is ready to test the next group of integrated circuits on the wafer. Accordingly, there remains a need for more efficient wafer testing, particular in the light of the increased concentration and complexity of integrated circuits on wafers.

SUMMARY

The present technology is generally directed to translators coupleable to opposing surfaces of microelectronic substrates, and associated systems and methods. In some embodiments, a method for testing a microelectronic substrate includes positioning a first translator in a first region proximate to a microelectronic substrate. The microelectronic substrate has a first major surface and a second major surface facing away from the first major surface, and electrically conductive through-substrate vias extending through the substrate. A first region of the microelectronic substrate extends outwardly from the first major surface of the microelectronic substrate and a second region extends outwardly from the second major surface. The method further includes releasably fixing the first translator relative to the microelectronic substrate at the first region; releasably fixing a second translator relative to the microelectronic substrate at the second region while the first translator is fixed relative to the microelectronic substrate at the first region; electrically accessing a first through-substrate via of the microelectronic substrate with the first translator while the first translator is positioned in the first region; and electrically accessing the first through-substrate via or a second through-substrate via of the microelectronic substrate with the second translator while both the first and second translators are releasably fixed relative to the microelectronic substrate.

DETAILED DESCRIPTION

The present technology is directed generally to translators coupleable to opposing surfaces of microelectronic substrates, e.g., for testing, and associated systems and methods. In particular embodiments, these techniques can take advantage of through-substrate (e.g., through-wafer or through-silicon) vias to access the microelectronic substrate from both sides and thereby increase the efficiency with which dies of the substrate are tested. Specific details of several embodiments of the technology are described below with reference to FIGS. 1A-10B. Several details describing structures or processes that are well-known and often associated with microelectronic devices and associated testing, but that may unnecessarily obscure some significant aspects of the disclosure, are not set forth in the following description for purposes of clarity. Moreover, although the following disclosure sets forth several embodiments of different aspects of the technology, several other embodiments of the technology can have different configurations or different components than those described in this section. As such, the technology may have other embodiments with additional elements and/or without several of the elements described below with reference to FIGS. 1A-10B.

Figure 1A:
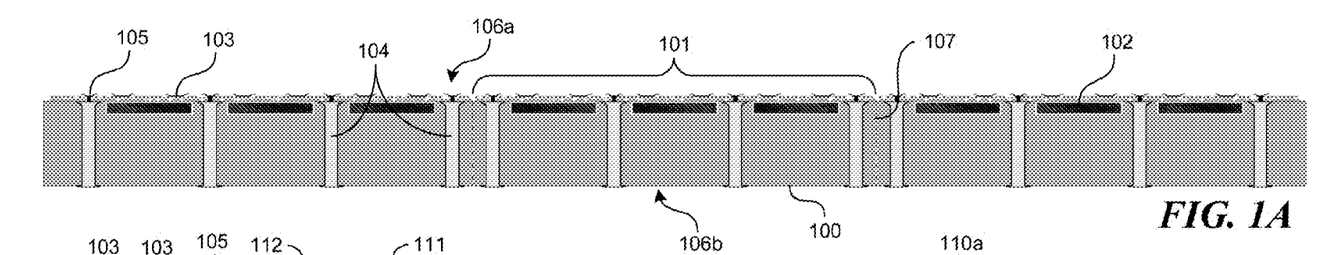
FIGS. 1A-1C illustrate a representative substrate (e.g., a wafer) having two opposing surfaces, and corresponding translators for electrically accessing the substrate from both surfaces in accordance with an embodiment of the present technology.

FIG. 1A is a partially schematic, cross-sectional illustration of a microelectronic substrate 100 (e.g., a semiconductor wafer) suitable for testing with devices and methods in accordance with the present technology. The representative microelectronic substrate 100 includes multiple dies or die sites 101 having corresponding die edges 107. After testing, the substrate 100 is singulated or diced along the die edges 107 to produce individual dies 101 that are encapsulated or otherwise packaged prior to use. Each die 101 can include one or more active areas 102. Dies pads 103 are accessible from a first side (e.g., a first major surface) 106a of the substrate 100. Through-substrate vias (e.g., through-silicon vias) 104 can provide electrical access to structures within the substrate 100 from both the first side 106a of the substrate 100 and an oppositely-facing second side (e.g., a second major surface) 106b. Through-substrate via pads 105 provide electrical access to the vias 104.

Figure 1B:
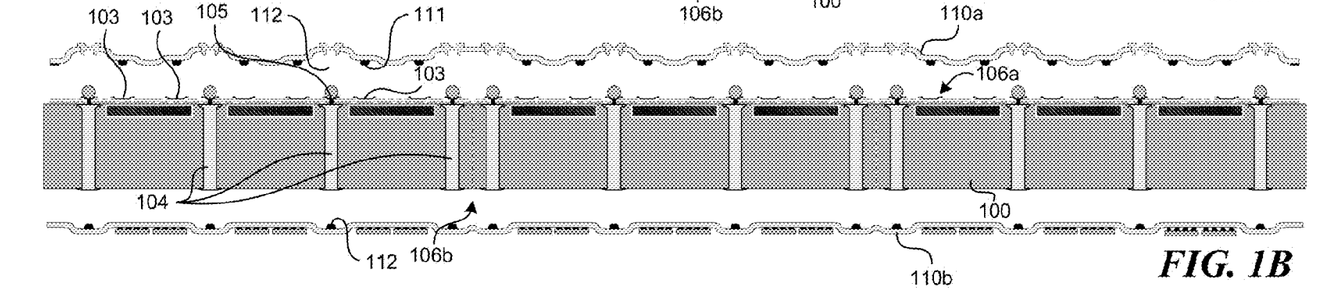

FIG. 1B illustrates a representative substrate 100 positioned between two translators 110, shown as a first translator 110a and a second translator 110b. The first translator 110a is positioned proximate to and facing toward the first side 106a of the substrate 100, and the second translator 110b is positioned proximate to and facing toward the second side 106b of the substrate 100. As used herein, the term "translator" refers generally to a structure having one or more conductive (e.g., metal) layers, with the translator being temporarily affixed to attached to or engaged with a wafer or other substrate, generally for testing purposes. Typically, the translator is configured to move with the substrate 100, e.g., from one station (e.g., a testing or processing station) to another. In general, the translator includes one set of contacts having spacings therebetween that match the spacings between the die pads 103 and/or the vias 104. This first set of contacts, sometimes referred to generally as wafer contacts or substrate contacts, are engaged with the substrate 100 during testing, and are located on a "wafer side" or "substrate side" of the translator. The translator also typically includes a second set of contacts e.g. located on an opposite "tester side" of the translator that may have different spacings, suitable for coupling to a tester or other testing device. Accordingly, the translator can provide an interface between the die pads, which are typically very closely spaced together, and the corresponding tester pads, which are typically spaced further apart. The translators can be temporarily attached to the substrate via vacuum forces, clamps, and/or other techniques so as to move with the substrate 100 from one station to another during testing, pre-testing and/or post-testing procedures.

The substrate or wafer contacts of the first translator 110a can include first conductors 111 positioned to contact the die pads 103 of the associated substrate 100, and second conductors 112 positioned to contact the through-substrate vias 104 (e.g., the via pads 105) at the first side 106a of the substrate 100. The second translator 110b can also include second conductors 112 positioned to contact the through-substrate vias 104 from the second side 106b of the substrate 100. Accordingly, the first translator 110a can access the through-substrate vias 104 from the first side 106a, and the second translator 110b can access the same or different through-substrate vias 104 from the second side 106b.

Figure 1C:
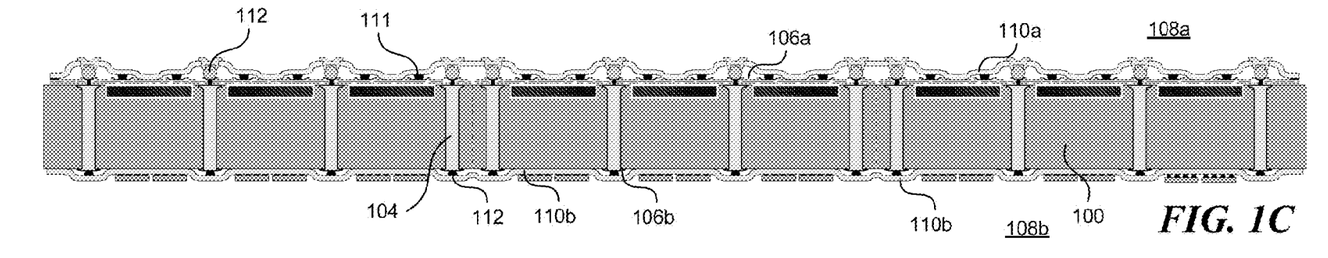

FIG. 1C illustrates the substrate 100 with the first and second translators 110a, 110b releasably attached to it. With the substrate 100 and the translators 110a, 110b in this configuration, the substrate 100 can be tested with electrical signals that access both the first and second sides 106a, 106b of the substrate 100. Accordingly, the first translator 110a is positioned in a first region 108a that extends outwardly from the first major surface 106a of the substrate 100, and the second translator 110b is positioned in a second region 108b that extends outwardly from the second major surface 106b of the substrate 100.

Figure 1D:
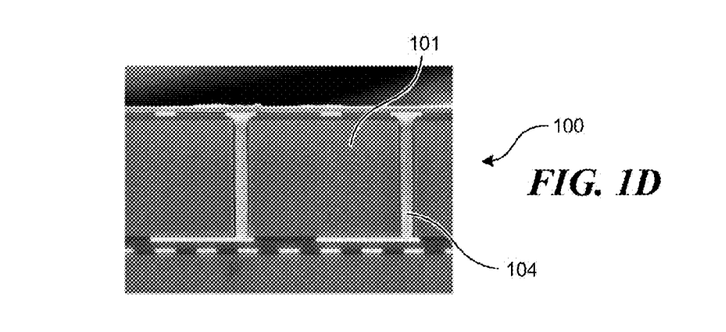
FIG. 1D is a scanning electron micrograph of a portion of a substrate of the type shown in FIGS. 1A-1C.

FIG. 1D is a scanning electron micrograph illustrating a portion of the substrate 100 shown in FIG. 1C. Accordingly, FIG. 1D illustrates individual dies 101 and associated through-substrate vias 104.

Figure 1E:
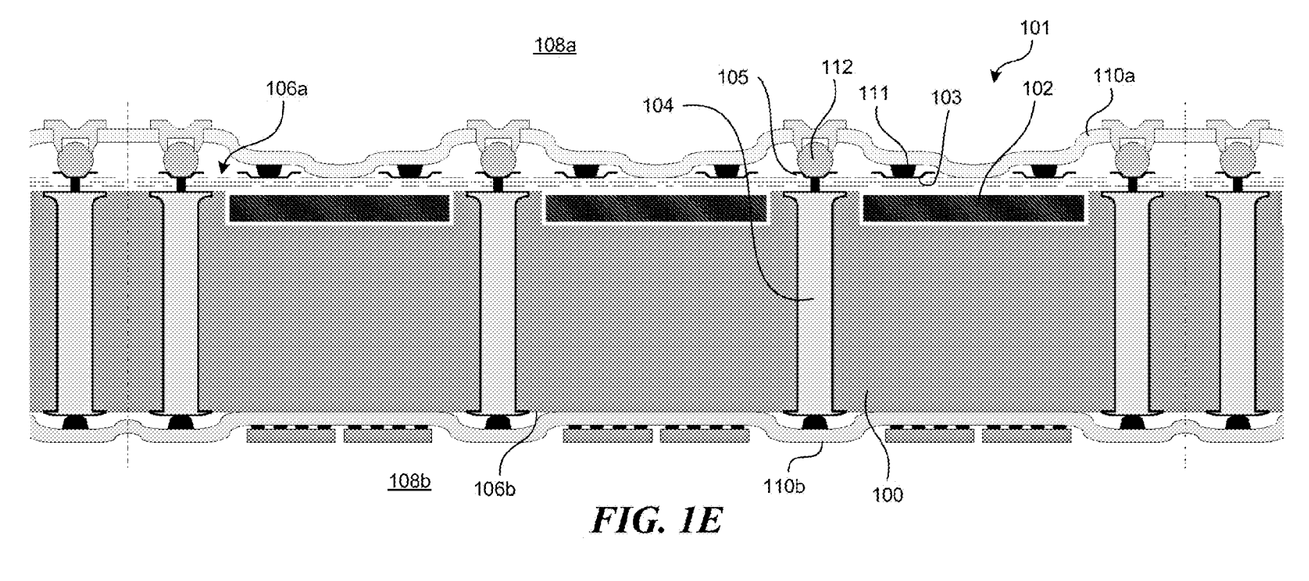
FIG. 1E is a partially schematic enlarged illustration of the substrate and two translators shown in FIG. 1C.

FIG. 1E is an enlarged illustration of a portion of the substrate 100 and the translators 110a, 110b shown in FIG. 1C.

Figure 2:
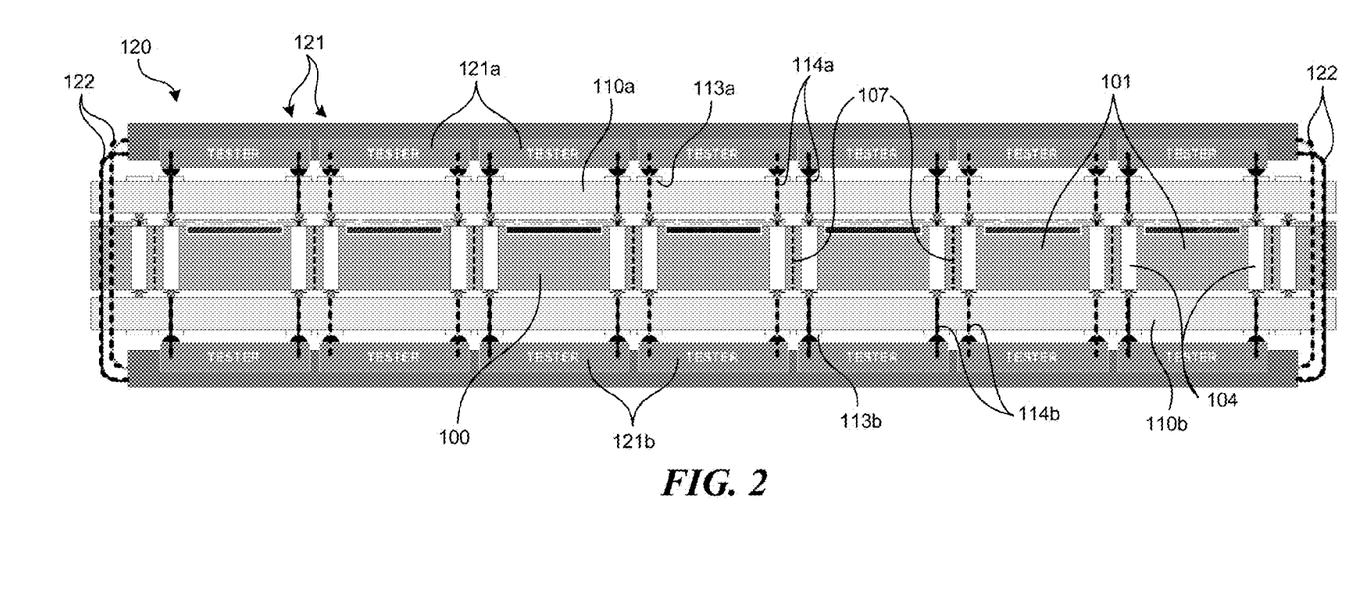
FIG. 2 is a partially schematic, cross-sectional illustration of a substrate and two translators coupled to a tester assembly in accordance with an embodiment of the present disclosure.

FIG. 2 is a partially schematic, cross-sectional illustration of a representative substrate 100 and representative translators 110a, 110b arranged for testing in accordance with an embodiment of the present technology. As shown in FIG. 2, the arrangement can include a tester assembly 120 that in turn includes multiple testers or test modules 121. The testers 121 can include first testers 121a positioned to access the first translator 110a, and second testers 121b positioned to access the substrate 100 via the second translator 110b. Accordingly, the first testers 121a can communicate electrically with first tester contacts 113a carried by the first translator 110a, and the second testers 121b can access the second translator 110b through second tester contacts 113b. The communications between the testers 121 and the substrate 100 are illustrated schematically in dotted lines as first signal paths 114a and second signal paths 114b. Tester signal paths 122 connect or provide communication between the first testers 121a and the second testers 121b. Accordingly, tests performed by the first testers 121a can be coordinated with tests performed by the second testers 121b. This function can be particularly useful for testing certain microelectronic devices, e.g., NAND devices, for which results from one test can direct which of multiple possible follow-on tests are conducted. Another advantage of the foregoing arrangement is that it can be used to test a die that ultimately is incorporated into a stack of dies. Such dies may use the through-substrate vias 104 to transmit different signals to pads located at the first side 106a than to pads located at the second side 106b. Accordingly, the first and second testers 121a, 121b can be programmed/configured to deliver and/or respond to the different signals that the dies 101 may generate. In addition to or in lieu of the foregoing, the second testers 121b can simulate a lower die, and the first testers 121a can simulate an upper die.

In particular embodiments, signals transmitted to and/or from the dies 101 through the through-substrate vias 104 can, in operation, travel in only one direction (e.g., toward only the first translator 110a or toward only the second translator 110b). Representative devices include diodes and tri-state devices. Accordingly, the ability to access both ends of individual through-substrate vias 104 can increase the versatility of the overall testing operation. In addition, the through-substrate via of one die can be used to facilitate testing of another die, as will be described further below. In further embodiments, signals are transmitted in both directions along one or more vias. For example, such signals can be used to test the integrity of unidirectional devices (which should transmit signals in only one direction) and/or test the ability of multi-directional devices to transmit signals in multiple directions.

Figure 3A:
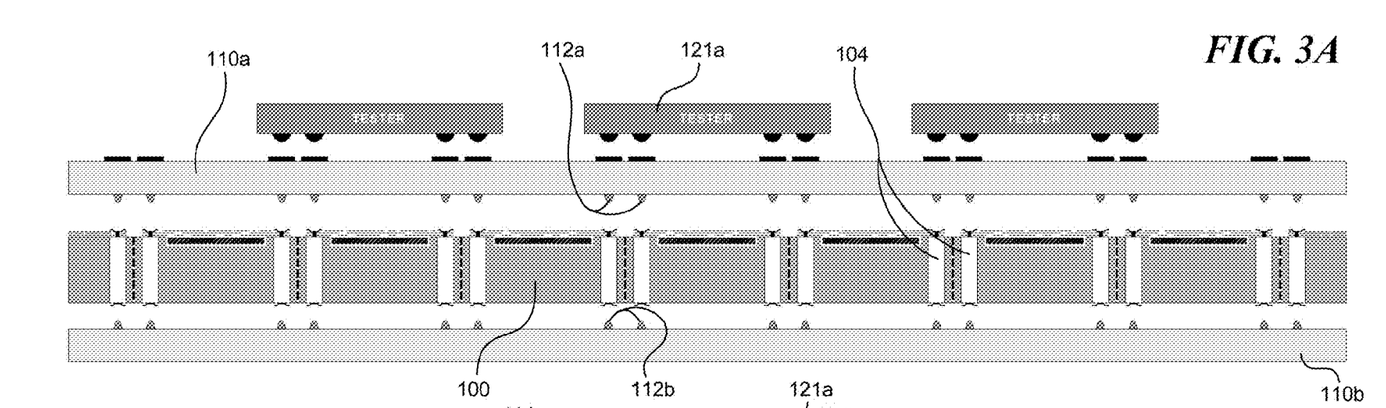
FIGS. 3A and 3B are partially schematic, cross-sectional illustrations of a substrate coupled to two translators that access unpowered dies in accordance with an embodiment of the present technology.
Figure 3B:
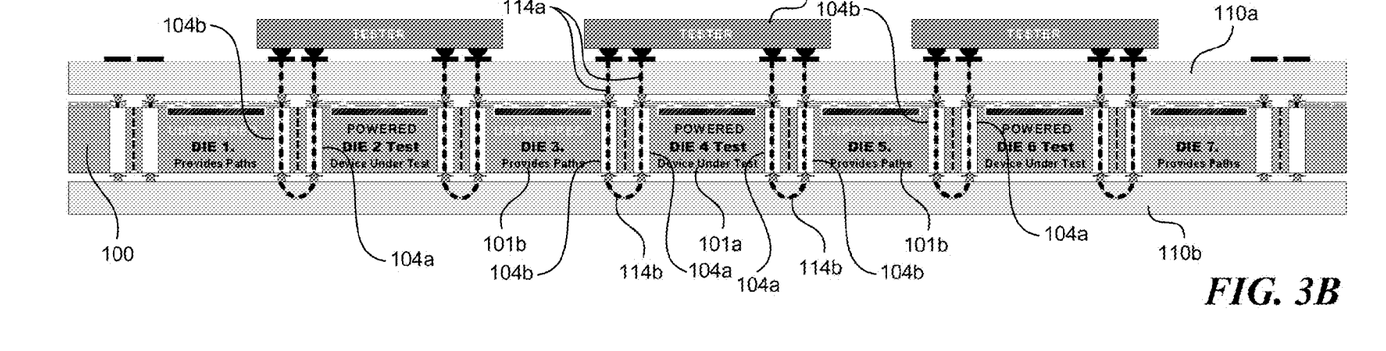

FIGS. 3A and 3B illustrate a representative substrate 100 with representative first and second translators 110a, 110b configured in accordance with a particular embodiment of the present technology. In FIG. 3A, the translators 110a, 110b and a set of first testers 121a are shown schematically in position for engaging the substrate 100. In FIG. 3B, the first and second translators 110a, 110b have been engaged with the substrate 100, and the first testers 121a have been engaged with the first translator 110a. In a particular aspect of this embodiment, the second translator 110b includes circuitry that allows the through-substrate vias of an unpowered or untested die to facilitate testing of a powered or test die (e.g., a die or device under test, or "DUT"). For example, FIG. 3B illustrates a first die 101a (also identified as "Die 4 Test") that is powered and under test, and is located between two second die 101b (also identified as "Unpowered Die 3" and "Unpowered Die 5") that are unpowered. A corresponding first tester 121a accesses the first die 101a by first through-substrate vias 104a of the first die 101a. The second translator 110b includes second signal paths 114b that connect the first through-substrate vias 104a of the first die with second through-substrate vias 104b of the second dies 101b. Accordingly, the first tester 121a can communicate with the first die 101a by first signal paths 114a that pass through both the first through-substrate vias 104a of the first die 101a, and the second through-substrate vias 104b of the second dies 101b. This arrangement can be used to increase the access available to each die that is currently under test by using adjacent (and/or other) dies that are not currently under test. For example, this arrangement can allow the first testers 121a to evaluate signals from the first die 101a that are typically transmitted unidirectionally "down" through the first through-substrate vias 104a toward the second translator 110b by using the second translator 110b to redirect such signals back up through the second vias 104b of the second dies 101b to the first testers 121a. In operation, all the dies can be tested by sequentially shifting the first testers 121a and/or connections between the testers and the dies 101a, 101b. In addition to or in lieu of the foregoing, the second vias 104b can be used to send instructions between the first and second translators 110a, 110b.

Figures 4A, 4B:
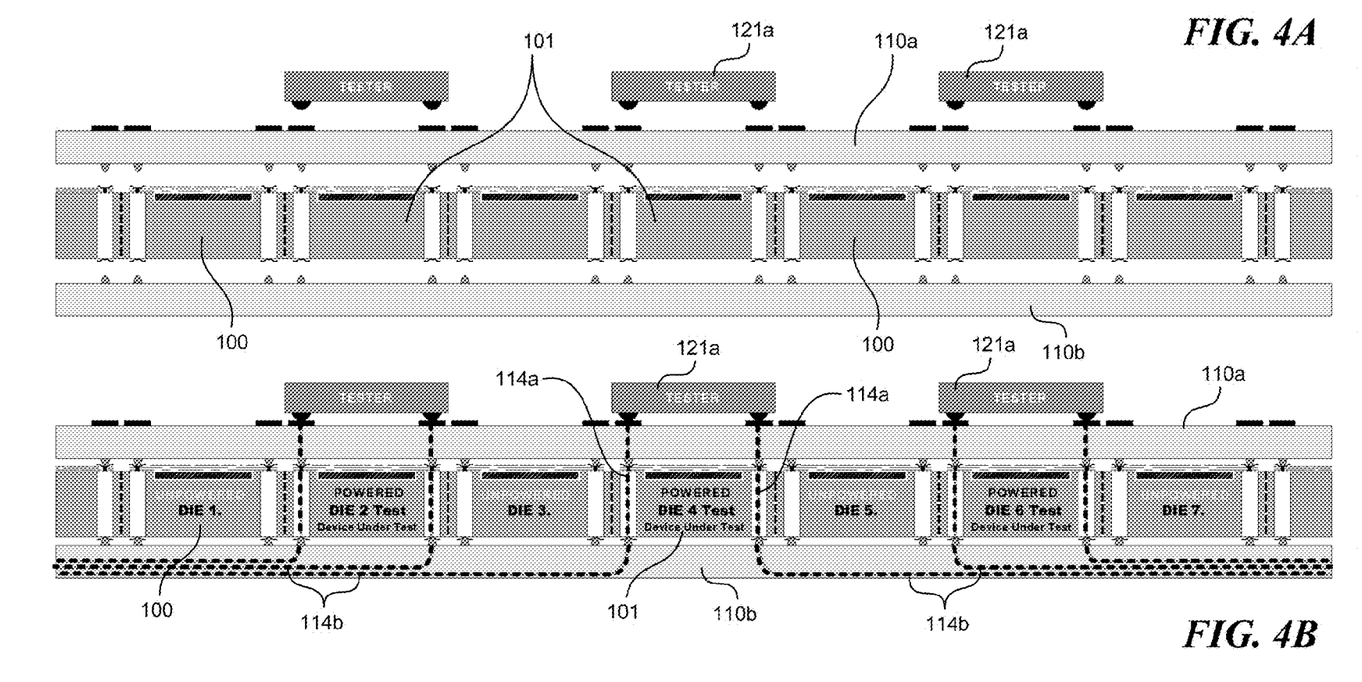
FIGS. 4A and 4B illustrate a substrate and two translators configured to direct test signals in a radially outward direction in accordance with an embodiment of the present technology.

FIGS. 4A and 4B illustrate another arrangement in which a second translator 110b is used to convey signals that may be conveyed to and/or received from components not shown in FIGS. 4A and 4B. For example, the first testers 121a can communicate with the dies 101 as indicated by the first signal paths 114a, and a second translator 110b can convey signals away, for example to/from additional testers (offsite or distributed testers) that are not visible in FIGS. 4A and 4B, as indicated by second signal paths 114b. The signals can be routed along paths that extend beyond the outer periphery of the substrate 100, as will be described further below with reference to FIGS. 7A and 7B.

Figure 5A:
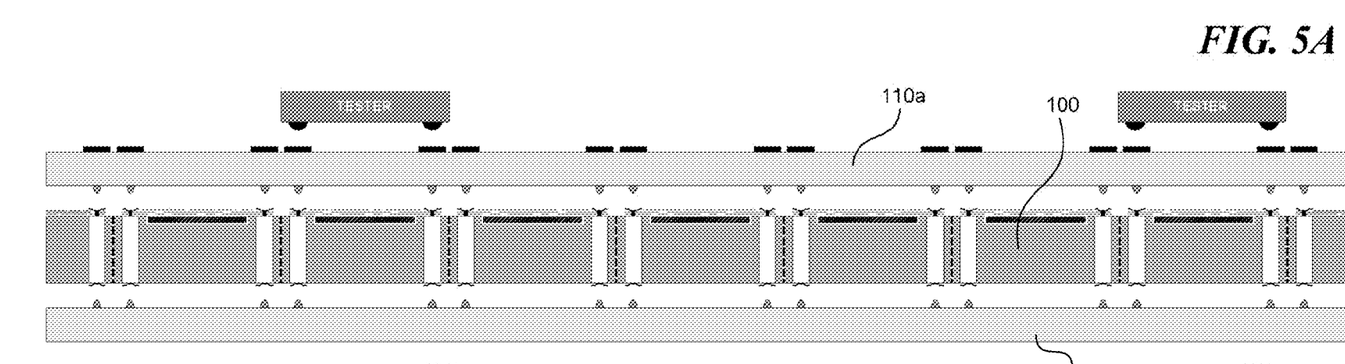
FIGS. 5A and 5B illustrate a substrate and two translators positioned to simulate stacked dies of an unsingulated substrate in accordance with an embodiment of the present technology.
Figure 5B:
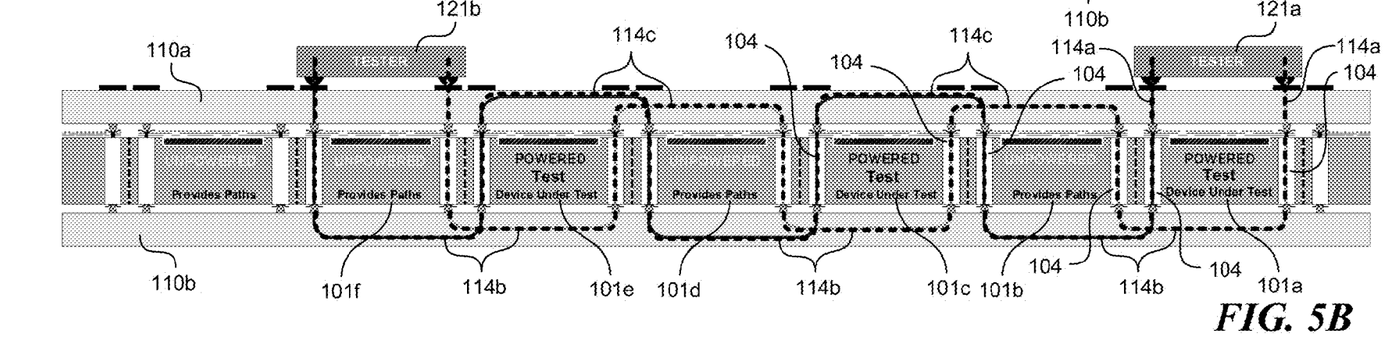

FIGS. 5A and 5B illustrate an arrangement in which the first and second translators 110a, 110b include signal paths that are used to test multiple unsingulated dies in a manner that emulates a stacked die arrangement. In a representative embodiment shown in FIG. 5B, a total of six dies 101a-101f are involved in a particular test that simulates three stacked dies. The first, third and fifth dies 101a, 101c, 101e are powered and tested. The second, fourth, and sixth dies 101b, 101d, 101f are unpowered, but provide pathways to connect the powered dies. The signal paths of each of the translators 110a, 110b are configured to use the unpowered dies to route signals from the bottom of one tested die to the top of the other, thus emulating a stacked die arrangement. For example, first signal paths 114a at the first translator 110a provide communication between a first tester 121a and the first die 101a. Second signal paths 114b at the second translator 110b connect the through-substrate vias 104 of the first die 101a to the through-substrate vias 104 of the second die 101b. Third signal paths 114c at the first translator 101a connect the through-substrate vias 104 of the second, unpowered die 101b with the through-substrate vias 104 of the third, powered die 101c. A similar arrangement is used to connect the third die 101c with the fifth die 101e, and route signals to a second tester 121b. In this manner, aspects of the operation of the dies that are typically evident only when the dies are in a stacked arrangement can be tested before the dies are singulated and actually placed in a stacked arrangement. Although individual dies may be tested together in a simulated stacked arrangement, once singulated, the dies do not necessarily need to be stacked with the same dies used during the simulation.

Figure 6A:
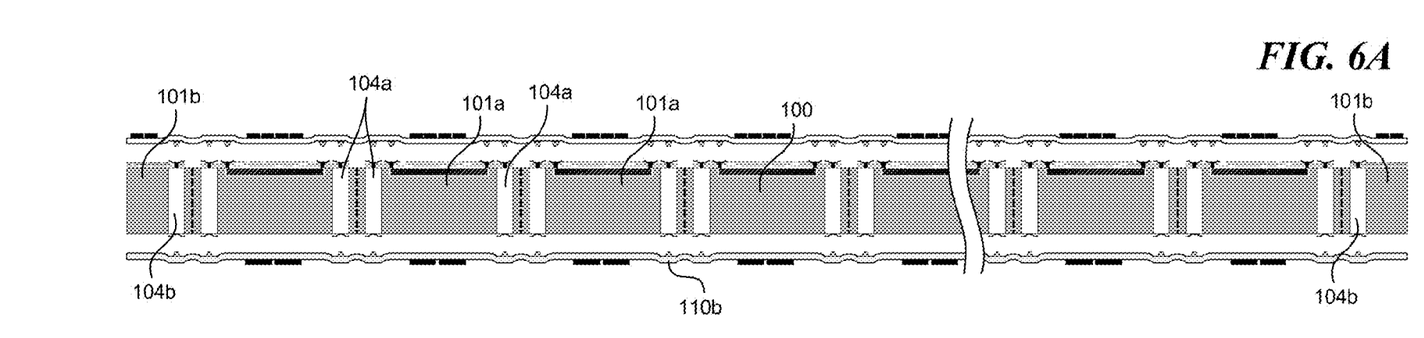
FIGS. 6A and 6B illustrate a substrate and two translators positioned to use the through-substrate vias of incomplete dies in accordance with an embodiment of the present technology.
Figure 6B:
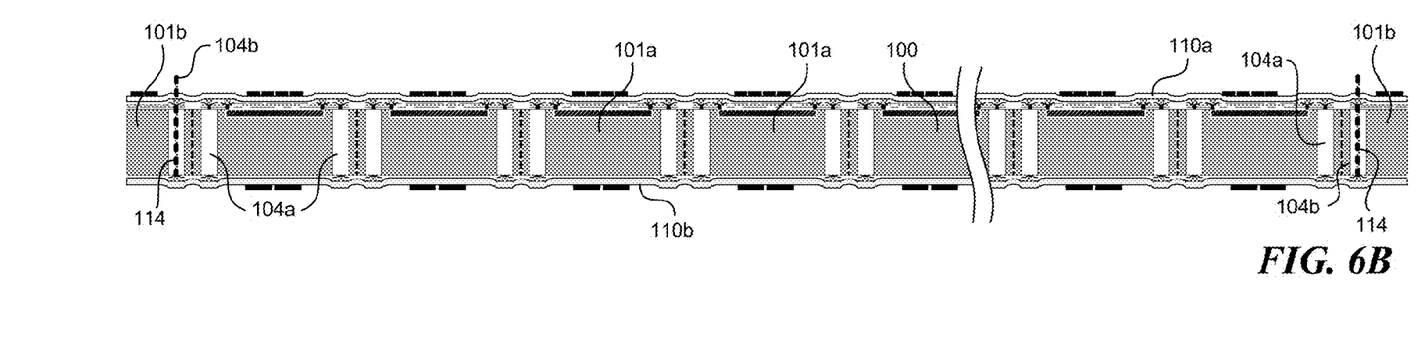

FIGS. 6A and 6B illustrate an arrangement for testing dies (e.g., complete, intact dies) by using the through-substrate vias of incomplete dies carried by the substrate 100. In particular, because the substrate 100 is typically circular and complete or whole dies 101a are typically rectangular, the outer periphery of the substrate 100 can include portions of incomplete or partial dies 101b. These incomplete dies 101b may have undergone at least some of the manufacturing processes associated with complete dies 101a, for example, the formation of through-substrate vias. Accordingly, the complete dies 101a can have first through-substrate vias 104a and the incomplete dies 101b can have second through-substrate vias 104b. The second through-substrate vias 104b can be used to provide access to first dies 101a by using the second translator 110b to convey signals along signal paths 114 between the second through-substrate vias 104b of partial or incomplete dies 101b and the first through-substrate vias 104a of complete dies 101a. Accordingly, the second vias 104b can provide a "pass-through" function.

Figure 7A:
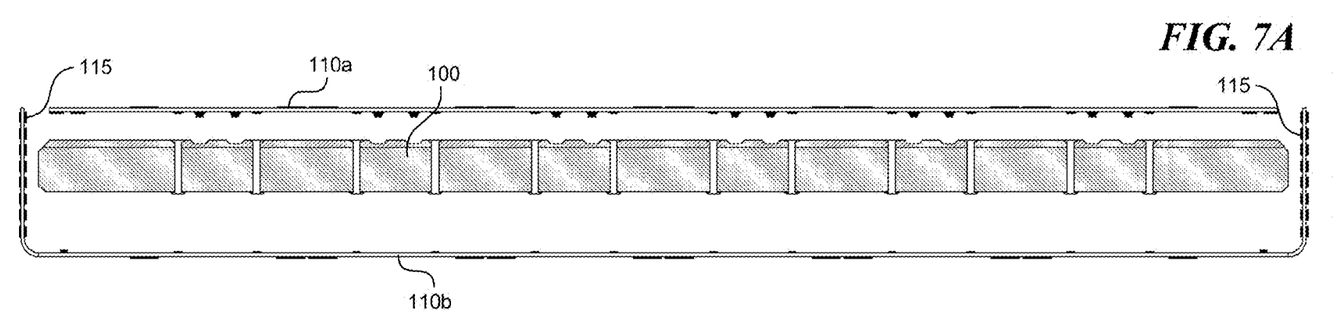
FIGS. 7A and 7B illustrate a substrate and two flexible translators configured in accordance with an embodiment of the present technology.
Figure 7B:
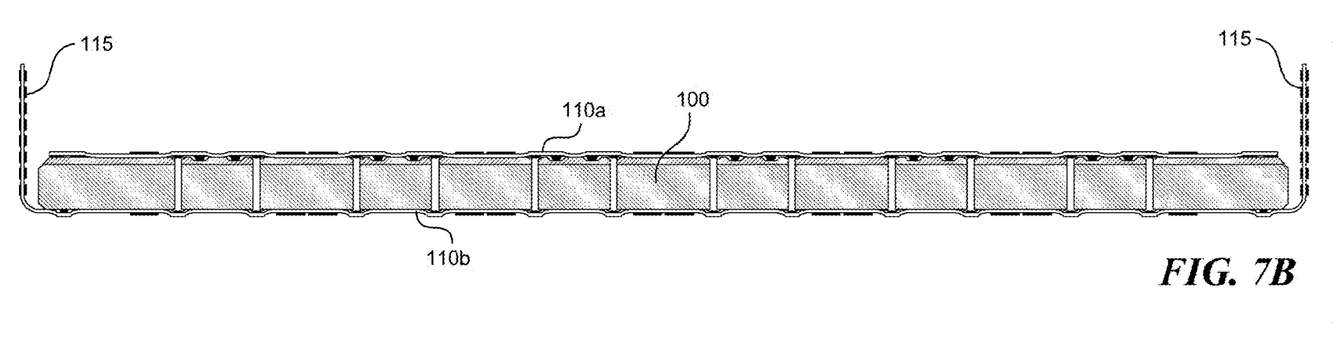

FIGS. 7A and 7B illustrate a configuration in which a representative substrate 100 is tested by relatively thin first and second translators 110a, 110b. The second translator 110b can have an "edge extended" configuration that includes edge extensions 115 extending beyond the periphery of the substrate 100. The edge extensions 115 can provide additional functional areas e.g., for coupling to testers and/or other external devices. The translators 110a, 110b can be formed from thin, flexible layered metal/dielectric materials to provide for low clearance in a vertical direction. Accordingly, this arrangement is particularly suitable where the vertical clearance requirements during testing are tight.

Figure 8A:
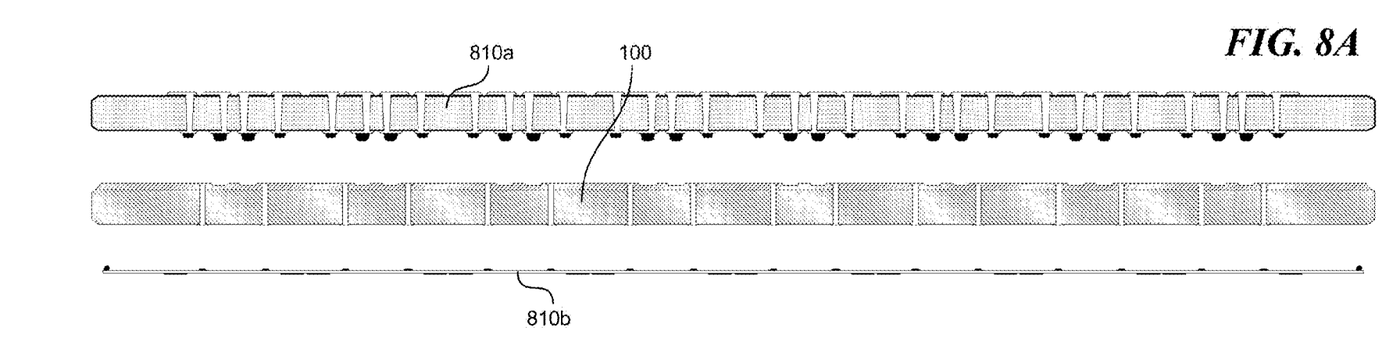
FIGS. 8A and 8B illustrate a substrate with one rigid translator and one flexible translator configured in accordance with an embodiment of the present technology.
Figure 8B:
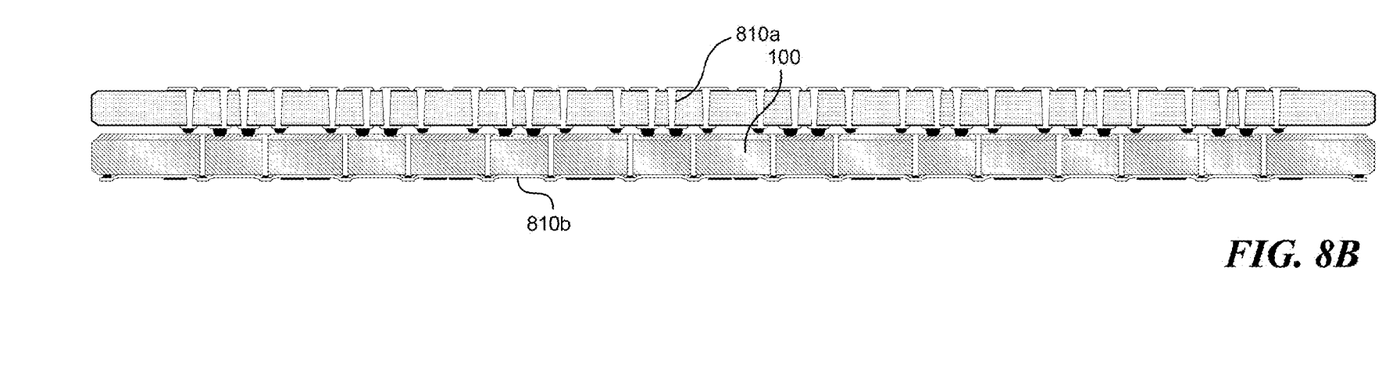

FIGS. 8A and 8B illustrate another arrangement in which a representative substrate 100 is positioned between a first translator 810a having a relatively thick configuration, and a second translator 810b having a thin configuration generally similar to that described above with reference to FIGS. 7A and 7B. This arrangement can be used where vertical clearance above the substrate 100 is not as tight or critical as the vertical clearance below the substrate 100.

Figure 9A:
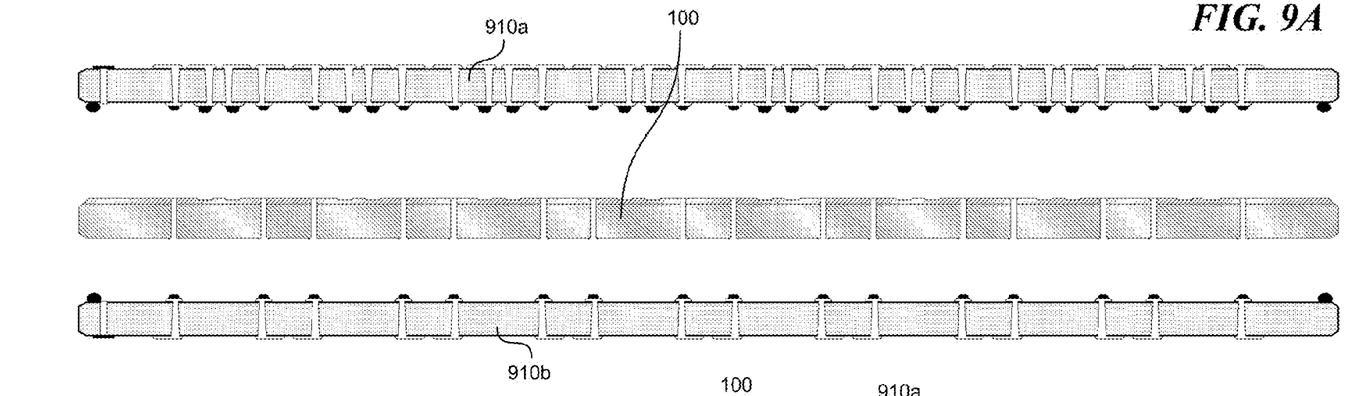
FIGS. 9A and 9B illustrate a substrate and two rigid translators configured in accordance with an embodiment of the present technology.
Figure 9B:
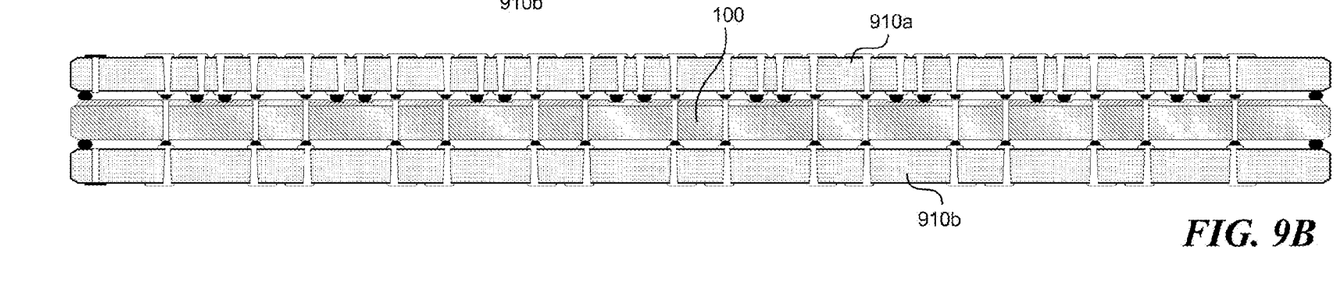

FIGS. 9A and 9B illustrate another arrangement in which a substrate 100 is positioned between two translators 910a, 910b, both of which have a relatively thick configuration. This arrangement can be used in installations for which vertical clearance both above and below the substrate 100 is not as tight or critical.

Figure 10A:
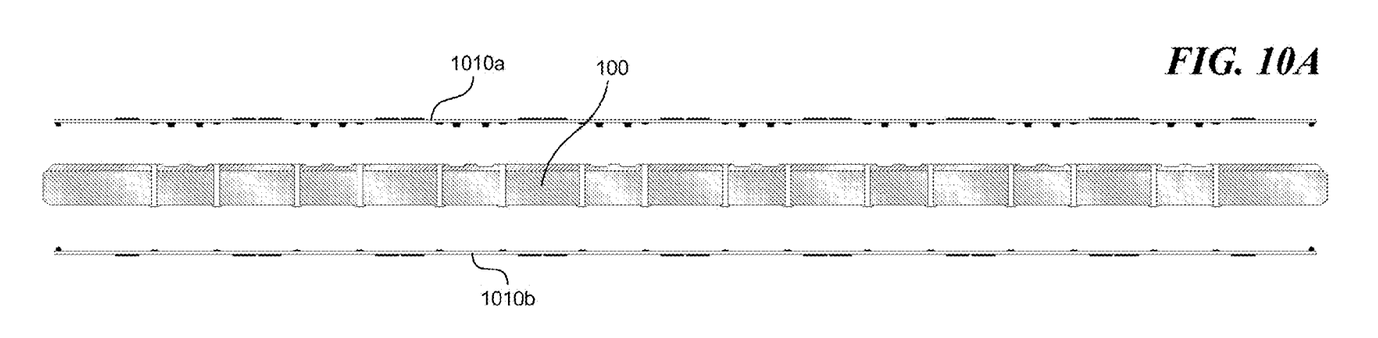
FIGS. 10A and 10B illustrate a substrate and two flexible translators configured in accordance with another embodiment of the present technology.
Figure 10B:
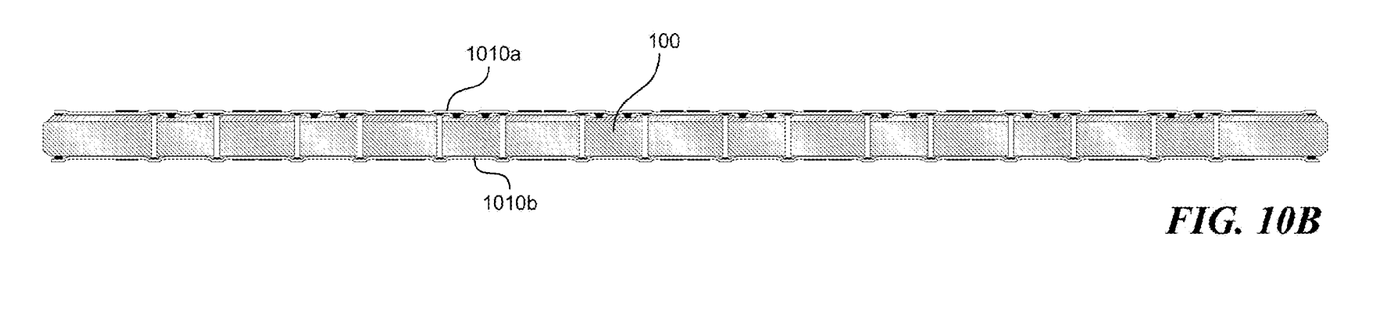

FIGS. 10A and 10B illustrate a substrate 100 positioned between first and second translators 1010a, 1010b, both of which are relatively thin, and neither of which include the edge extender arrangement described above with reference to FIGS. 7A and 7B. Accordingly, this arrangement can be used in instances for which the communications to and from the substrate 100 do not require a density of signal paths and/or other features that necessitate or otherwise require an edge extender.

Particular embodiments of the present technology are directed to methods for testing a microelectronic substrate, e.g., a wafer containing multiple dies. A representative method includes positioning a first translator in a first region proximate to a microelectronic substrate. The microelectronic substrate has a first major surface and a second major surface facing away from the first major surface, and has electrically conductive through-substrate vias extending through the substrate, with a first region extending outwardly from the first major surface of the microelectronic substrate and a second region extending outwardly from the second major surface. The method can further include releasably fixing the first translator relative to the microelectronic substrate at the first region, releasably fixing a second translator relative to the microelectronic substrate at the second region while the first translator is fixed relative to the microelectronic substrate at the first region, electrically accessing a first through-substrate via of the microelectronic substrate with the first translator while the first translator is positioned in the first region, and electrically accessing the first through-substrate via or a second through-substrate via of the microelectronic substrate with the second translator while both the first and second translators are fixed relative to the microelectronic substrate.

In further particular embodiments, the method further includes simultaneously electrically accessing the microelectronic substrate with both the first and second translators. In still further particular embodiments, the method further includes receiving a first signal from the first translator at the second translator, and in response, directing the first signal or a second signal to the microelectronic substrate or the first translator. In yet further embodiments, the first via is part of a first die, and the method further includes simulating stacked dies by routing a signal from the first translator through the first via of the first die to the second translator, using the second translator to route the signal from the first via to a second via, receiving the signal from the second via at the first translator, and using first translator to route the signal from the second via to a third via of the microelectronic substrate, the third via being part of a second die different than the first die.

The methods disclosed herein include and encompass, in addition to methods of making and using the disclosed devices and systems, methods of instructing others to make and use the disclosed devices and systems. Accordingly, any and all methods of use and manufacture disclosed herein also fully disclose and enable corresponding methods of instructing such methods of use and manufacture. Methods of instructing such use and manufacture may take the form of computer-readable-medium-based executable programs or processes.

From the foregoing, it will be appreciated that specific embodiments of the present technology have been described herein for purposes of illustration, but that various modifications may be made without deviating from the technology. For example, translators having configurations other than those expressly described above can be used to provide access to substrates from opposing surfaces of the substrates. Substrates can be tested in a generally horizontal orientation, as shown in the Figures, or in a vertical or other orientation in other embodiments. In some embodiments, the same signal received by one translator from another is transmitted directly to another site, e.g., back to the first translator, or to a die under test. In some embodiments, the received signal is altered before further transmission, or provides a basis for transmission of a different signal. Certain aspects of the technology described in the context of particular embodiments may be combined or eliminated in other embodiments. For example, the signal paths described in the context of FIGS. 2-5B can be implemented in translators having a relatively thin profile or a relatively thick profile. Further, while advantages associated with certain embodiments of the technology have been described in the context of those embodiments, other embodiments may also exhibit such advantages and not all embodiments need necessarily exhibit such advantages to fall within the scope of the present technology. Accordingly, the present disclosure and associated technology can encompass other embodiments not expressly shown or described herein. The following examples provide additional representative embodiments of the present technology.

I claim:

1. A method for testing a microelectronic substrate, comprising;
    positioning a first translator in a first region proximate to a microelectronic substrate, the microelectronic substrate having a first major surface and a second major surface facing away from the first major surface, the microelectronic substrate having electrically conductive through-substrate vias extending through the substrate, a first region extending outwardly from the first major surface of the microelectronic substrate and a second region extending outwardly from the second major surface;
    releasably fixing the first translator relative to the microelectronic substrate at the first region;
    releasably fixing a second translator relative to the microelectronic substrate at the second region while the first translator is fixed relative to the microelectronic substrate at the first region;
    electrically accessing a first through-substrate via of the microelectronic substrate with the first translator while the first translator is positioned in the first region; and
    electrically accessing the first through-substrate via or a second through-substrate via of the microelectronic substrate with the second translator while both the first and second translators are releasably fixed relative to the microelectronic substrate, wherein accessing the microelectronic substrate with the first translator and electrically accessing the microelectronic substrate with the second translator includes:
  transmitting a signal along a via of an unpowered die using one of the first and second translators; and
  transmitting the signal to a powered die using the other of the first and second translators.

2. The method of claim 1 wherein electrically accessing the microelectronic substrate with the first translator and electrically accessing the microelectronic substrate with the second translator includes simultaneously electrically accessing the microelectronic substrate with both the first and second translators.

3. The method of claim 1 wherein accessing the microelectronic substrate with the first translator includes directing a signal to the second translator along the first via, and wherein accessing the microelectronic substrate with the second translator includes receiving the signal.

4. The method of claim 3 wherein accessing the microelectronic substrate with the second translator includes directing the signal received from the first translator, or another signal, to the first translator.

5. The method of claim 1 wherein electrically accessing the microelectronic substrate with the first translator and electrically accessing the microelectronic substrate with the second translator includes:
  receiving a first signal from the first translator at the second translator; and
  in response to receiving the first signal, directing the first signal or a second signal to the microelectronic substrate.

6. The method of claim 1 wherein electrically accessing the microelectronic substrate with the first translator and electrically accessing the microelectronic substrate with the second translator includes:
  receiving a first signal from the first translator at the second translator; and
  in response to receiving the first signal, directing the first signal or a second signal to the first translator.

7. The method of claim 1 wherein the first via is part of a die that is powered when the first signal is directed, and the second via is part of a die that is unpowered when the first or second signal is directed along the second through-substrate via.

8. The method of claim 1, further comprising routing signals received at the second translator from first translator to a device other than the microelectronic substrate, the first translator and the second translator.

9. The method of claim 1 wherein accessing the microelectronic substrate with the first translator and electrically accessing the microelectronic substrate with the second translator includes:
  transmitting a signal along a via of an incomplete die using one of the first and second translators; and
  transmitting the signal to a complete die using the other of the first and second translators.

10. The method of claim 1 wherein a device carried by the microelectronic substrate is accessible to signals traveling in a first direction along a first via, but not to signals traveling in a second direction opposite the first direction along the first via, and wherein accessing the microelectronic substrate with the first translator and electrically accessing the microelectronic substrate with the second translator includes:
  transmitting a signal from one of the first and second translators to the other along a second via in the second direction; and
  directing the signal from the other of the first and second translators along the first via in the first direction.

11. The method of claim 1 wherein accessing the microelectronic substrate with the first translator and electrically accessing the microelectronic substrate with the second translator includes:
  directing a first signal in a first direction through a via from one of the first and second translators; and
  directing a second signal in a second direction, opposite the first direction, through the via from the other of the first and second translators.

12. The method of claim 1 further comprising supporting the microelectronic substrate with the second translator as the microelectronic substrate is moved.

13. A method for testing a microelectronic substrate, comprising:
  positioning a first translator in a first region proximate to a microelectronic substrate, the microelectronic substrate having a first major surface and a second major surface facing away from the first major surface, the microelectronic substrate having electrically conductive through-substrate vias extending through the substrate, a first region extending outwardly from the first major surface of the microelectronic substrate and a second region extending outwardly from the second major surface;
  releasably fixing the first translator relative to the microelectronic substrate at the first region;
  electrically accessing at least a first through-substrate via of the microelectronic substrate with the first translator while the first translator is positioned in the first region;
  releasably fixing a second translator relative to the microelectronic substrate at the second region; and
  electrically accessing at least the first or a second through-substrate via of the microelectronic substrate with the second translator,
  wherein the first translator has a first thickness and the second translator has a second thickness different than the first thickness.

14. The method of claim 13 wherein electrically accessing the microelectronic substrate with the first translator and electrically accessing the microelectronic substrate with the second translator includes electrically accessing the microelectronic substrate while both the first and second translators are releasably fixed to the microelectronic substrate.

15. A microelectronic substrate testing arrangement, comprising:
  a microelectronic substrate having a first major surface and a second major surface facing away from the first major surface, the microelectronic substrate having electrically conductive through-substrate vias extending through the substrate, the vias being electrically accessible from both the first major surface and the second major surface;
  a first translator releasably connected to the microelectronic substrate and positioned in a first region extending outwardly from the first major surface, the first translator including first electrical signal paths that access the through-substrate vias from the first region; and
  a second translator releasably connected to the microelectronic substrate simultaneously with the first translator, the second translator being positioned in a second region extending outwardly from the second major surface of the microelectronic substrate, the second translator including second electrical signal paths that access the through-substrate vias from the second region,
wherein the microelectronic substrate includes complete dies and partial dies, and wherein at least one of the first and second translators accesses the microelectronic substrate through a via of a partial die.

16. The arrangement of claim 15 wherein the first translator has a first thickness and the second translator has a second thickness different than the first thickness.

17. The arrangement of claim 15 wherein both the first and second translators accesses the microelectronic substrate through one or more vias of a partial die.

18. A method for testing a microelectronic substrate, comprising;
positioning a first translator in a first region proximate to a microelectronic substrate, the microelectronic substrate having a first major surface and a second major surface facing away from the first major surface, the microelectronic substrate having electrically conductive through-substrate vias extending through the substrate, a first region extending outwardly from the first major surface of the microelectronic substrate and a second region extending outwardly from the second major surface;
releasably fixing the first translator relative to the microelectronic substrate at the first region;
releasably fixing a second translator relative to the microelectronic substrate at the second region while the first translator is fixed relative to the microelectronic substrate at the first region;
electrically accessing a first through-substrate via of the microelectronic substrate with the first translator while the first translator is positioned in the first region; and
electrically accessing the first through-substrate via or a second through-substrate via of the microelectronic substrate with the second translator while both the first and second translators are releasably fixed relative to the microelectronic substrate, wherein electrically accessing the microelectronic substrate with the first translator and electrically accessing the microelectronic substrate with the second translator includes:
directing a first signal from the first translator along the first via
receiving a first signal from the first translator at the second translator;
in response to receiving the first signal, directing the first signal or a second signal to the first translator or the microelectronic substrate along the second through-substrate via, the second through-substrate via being different than the first through-substrate via;
wherein the first via is part of a die that is powered when the first signal is directed, and the second via is part of a die that is unpowered when the first or second signal is directed along the second through-substrate via.

19. A method for testing a microelectronic substrate, comprising;
positioning a first translator in a first region proximate to a microelectronic substrate, the microelectronic substrate having a first major surface and a second major surface facing away from the first major surface, the microelectronic substrate having electrically conductive through-substrate vias extending through the substrate, a first region extending outwardly from the first major surface of the microelectronic substrate and a second region extending outwardly from the second major surface;
releasably fixing the first translator relative to the microelectronic substrate at the first region;
releasably fixing a second translator relative to the microelectronic substrate at the second region while the first translator is fixed relative to the microelectronic substrate at the first region;
electrically accessing a first through-substrate via of the microelectronic substrate with the first translator while the first translator is positioned in the first region; and
electrically accessing the first through-substrate via or a second through-substrate via of the microelectronic substrate with the second translator while both the first and second translators are releasably fixed relative to the microelectronic substrate
wherein the first via is part of a first die, and wherein the method further comprises simulating stacked dies by:
routing a signal from the first translator through the first via to the second translator;
using the second translator to route the signal from the first via to the second via;
receiving the signal from the second via at the first translator; and
using first translator to route the signal from the second via to a third via of the microelectronic substrate, the third via being part of a second die different than the first die.

\* \* \* \* \*